US007729150B2

(12) United States Patent
Sarin et al.

(10) Patent No.: US 7,729,150 B2
(45) Date of Patent: *Jun. 1, 2010

(54) HIGH-SPEED AND LOW-POWER DIFFERENTIAL NON-VOLATILE CONTENT ADDRESSABLE MEMORY CELL AND ARRAY

(75) Inventors: Vishal Sarin, Cupertino, CA (US); Hieu Van Tran, San Jose, CA (US); Isao Nojima, Los Altos, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/176,281

(22) Filed: Jul. 18, 2008

(65) Prior Publication Data

US 2008/0278986 A1 Nov. 13, 2008

Related U.S. Application Data

(60) Continuation of application No. 11/717,922, filed on Mar. 13, 2007, now Pat. No. 7,423,895, which is a division of application No. 10/893,811, filed on Jul. 19, 2004, now Pat. No. 7,196,921.

(51) Int. Cl.
*G11C 15/00* (2006.01)
(52) U.S. Cl. .................. 365/49.1; 365/202; 365/189.07; 365/185.08; 365/49.11; 365/49.17
(58) Field of Classification Search ................. 365/49.1, 365/49.11, 49.17, 202, 189.07, 185.08
See application file for complete search history.

(56) References Cited

U.S. PATENT DOCUMENTS

| 5,029,130 | A | | 7/1991 | Yeh |
|---|---|---|---|---|
| 5,051,948 | A | * | 9/1991 | Watabe et al. .......... 365/185.07 |
| 5,930,161 | A | | 7/1999 | Sheikholeslami et al. |
| 5,949,696 | A | | 9/1999 | Threewitt |
| 6,005,790 | A | | 12/1999 | Chan et al. |
| 6,078,513 | A | | 6/2000 | Ong et al. |

(Continued)

*Primary Examiner*—Viet Q Nguyen
(74) *Attorney, Agent, or Firm*—DLA Piper LLP (US)

(57) ABSTRACT

A differential non-volatile content addressable memory array has a differential non-volatile content addressable memory cell which uses a pair of non-volatile storage elements. Each of the non-volatile storage elements can be a split-gate floating gate transistor or a stack gate floating gate transistor having a first terminal, a second terminal, a channel therebetween and a floating gate over at least a portion of the channel to control the conduction of electrons in the channel, and a control gate. The floating gate storage transistor can be in one of two states: a first state, such as erase, in which current can flow between the first terminal and the second terminal, and a second state, such as programmed, in which substantially no current flows between the first terminal and the second terminal. A pair of differential compare data lines connects to the control gate of each of the pair of non-volatile floating gate transistors. A match line connects to the first terminal of each of the pair of non-volatile floating gate transistors to a first voltage. Finally, the second terminals of each storage element is connected to a second voltage, different from the first voltage. A current passing through the memory cell is indicative of a mis-match between the contents of the compare data lines and the contents of the storage elements.

13 Claims, 8 Drawing Sheets

U.S. PATENT DOCUMENTS

| | | |
|---|---|---|
| 6,094,368 A | 7/2000 | Ching |
| 6,157,558 A * | 12/2000 | Wong ....................... 365/49.11 |
| 6,262,907 B1 * | 7/2001 | Lien et al. ................. 365/49.12 |
| 6,373,739 B1 | 4/2002 | Lien et al. |
| 6,614,685 B2 | 9/2003 | Wong |
| 6,639,818 B1 * | 10/2003 | Nojima .................... 365/49.15 |
| 6,760,242 B1 | 7/2004 | Park et al. |
| 7,196,921 B2 * | 3/2007 | Sarin et al. ............... 365/49.17 |
| 7,423,895 B2 * | 9/2008 | Sarin et al. ................. 365/49.1 |
| 7,499,303 B2 * | 3/2009 | Lien et al. .................. 365/49.1 |
| 2003/0035322 A1 | 2/2003 | Wong |

* cited by examiner

HIGH-SPEED AND LOW-POWER DIFFERENTIAL NON-VOLATILE CONTENT ADDRESSABLE MEMORY CELL AND ARRAY

CROSS-REFERENCE TO RELATED APPLICATIONS

This is a continuation of application Ser. No. 11/717,922 filed Mar. 13, 2007 now U.S. Pat. No. 7,423,895, which is a division of application Ser. No. 10/893,811, filed Jul. 19, 2004, now U.S. Pat. No. 7,196,921, which is incorporated herein by reference in its entirety.

TECHNICAL FIELD

The present invention relates to a differential non-volatile content addressable memory cell and array that is capable of high-speed and low-power operation. More particularly, the present invention relates to a high-speed, low-power differential non-volatile content addressable memory cell either binary or ternary and an array using a compare data line that is isolated from the conducting channel.

BACKGROUND OF THE INVENTION

Content addressable memory cell and array are well known in the art. See, for example, U.S. Pat. Nos. 6,078,513; 5,949, 696; 5,930,161; and 5,051,943. A differential non-volatile content addressable memory cell and array is also well known in the art. See, for example, U.S. Pat. No. 6,005,790.

Referring to FIG. 1, there is shown a binary differential volatile content addressable memory array 10 of the prior art. In this memory array 10, a differential content addressable memory cell, such as cell 12a, is comprised of pair of SRAMs, each storing data complementary to one another. The cell 12a is queried by comparing the data on the compare data line 18a and the compare data bar line 18b to the data stored in the cell 12a. The match line 14 is pre-charged to a pre-determined voltage. During the compare event, all the rows are compared at the same time and each match line 14 that fails the comparison of the compare data with the stored data in each row is pulled down. The result of the comparison in each row is stored in a latch 16. The array 10 is a binary content addressable memory array, in that each cell 12 stores a binary state. Thus, each cell 12 stores either the state of "10" or "01." Each cell 12, thus has two states. Although the content addressable memory array 10 is of high speed because the memory cell 12 uses an SRAM as the storage element, it is volatile and further has high power requirements.

Referring to FIG. 2, there is shown a ternary content addressable memory array 20 of the prior art. The ternary content addressable memory array 20 is similar to the binary content addressable memory array 10 of the prior art shown in FIG. 1. The array 20 comprises a plurality of memory cells 22 arranged in the plurality of rows and columns. Each memory cell 22 has two storage elements 12a and 12b for storing the data bits and two storage elements 13a and 13b for storing the mask bit 13. Each of the storage elements 12a and 12b uses an SRAM cell. Data that needs to be compared during the compare event is driven in the compare data line 18a and the compare data bar line 18b. These lines are supplied to the data bit storage elements 12a and 12b from which either the state of "10" or "01" are stored just like that shown and described in FIG. 1. As for the mask bit 13, the mask bit 13 stored in the mask bit storage elements 13a and 13b can be in either the state of "11" or "00." If the mask bit 13 is in one state, such as "11," then that storage is used to mask the bit 13 from the compare event as to make it a "don't care" comparison. Again, similar to the array 10, the match line 14 is pre-charged to a pre-determined voltage. During the compare event, all the rows are compared at the same time and each match line that fails the comparison of the compare data with the stored data is pulled down. Only those bits participating in the compare event that are not masked by the respective mask bits are compared. The final comparison results are stored in latches 16. Similar to the array 10, the array 20, using SRAM storage elements has the properties of high speed but also high power and volatility.

Referring to FIG. 3, there is shown an example of a differential non-volatile content addressable memory cell 30 of the prior art, as exemplified by U.S. Pat. No. 6,639,818. In this differential non-volatile content addressable memory cell 30, a pair of non-volatile transistors 32a and 32b form the content addressable memory cell 30. Each of the non-volatile memory transistors 32 has a first terminal and a second terminal with a channel region therebetween. The first terminal is connected to a compare data line 18a or a compare data bar line 18b. The second terminal is connected to a common match line 14. A floating gate, closer to the second terminal or the match line 14, than to the first terminal, controls a portion of the channel region with a control gate controlling the conduction of another portion of the channel region. A word line 34 is connected to the control gate of each of the non-volatile transistor elements 32a and 32b. The non-volatile content addressable memory cell 30 is not a ternary cell, because it cannot mask each individual bit in the array.

Although the differential non-volatile content addressable memory cell 30 (and the array in which these cells 30 are formed) satisfy the criteria of non-volatility, and density, they suffer from having a leakage current. During the match event, there is a DC current leakage from the driven match line through the unmatched cells since the driven data lines are not isolated from the conducting channel. The compare data line 18a and the compare data bar line 18b are connected directly to the channel. Since the match event for all rows occur simultaneously, this increases a power consumption problem. Further, since there needs to be at most only a single unmatched cell in an entire row to cause a mismatch condition for that row, the sensing amplifiers of the array that contains the cells 30 must be able to detect the pre-charged match line 14 moving only slightly, if it moves at all, during the compare event. This slows down the event detection, in that the sense amplifiers must wait to detect the possibility of a slight movement condition of the match line 14. Furthermore, there are sensing reliability issues that impose limitations on the array architecture.

Hence, there is need for differential non-volatile content addressable memory cell that can detect reliably at high speed and consume low power.

SUMMARY OF THE INVENTION

In the present invention, a differential non-volatile content addressable memory cell comprises a pair of non-volatile storage elements. Each of the non-volatile storage elements has a first terminal, a second terminal and a control terminal for controlling the flow of current between the first terminal and the second terminal. Each of the storage elements is characterized by capable of being in one of two non-volatile states: a first state in which a first current flows between the first terminal and the second terminal and a second state in which a second current, less than the first current, flows between the first terminal and the second terminal. A pair of differential data lines is connected to the pair of non-volatile storage elements with one data line connected to the control terminal of one of the pair of storage elements. A match line is connected to the first terminal of each of the pair of non-volatile storage elements for connection to a first voltage. The second terminals of each of the pair of non-volatile storage elements is for connecting to a second voltage, different from the first voltage.

DETAILED DESCRIPTION OF THE INVENTION

Figure 1:
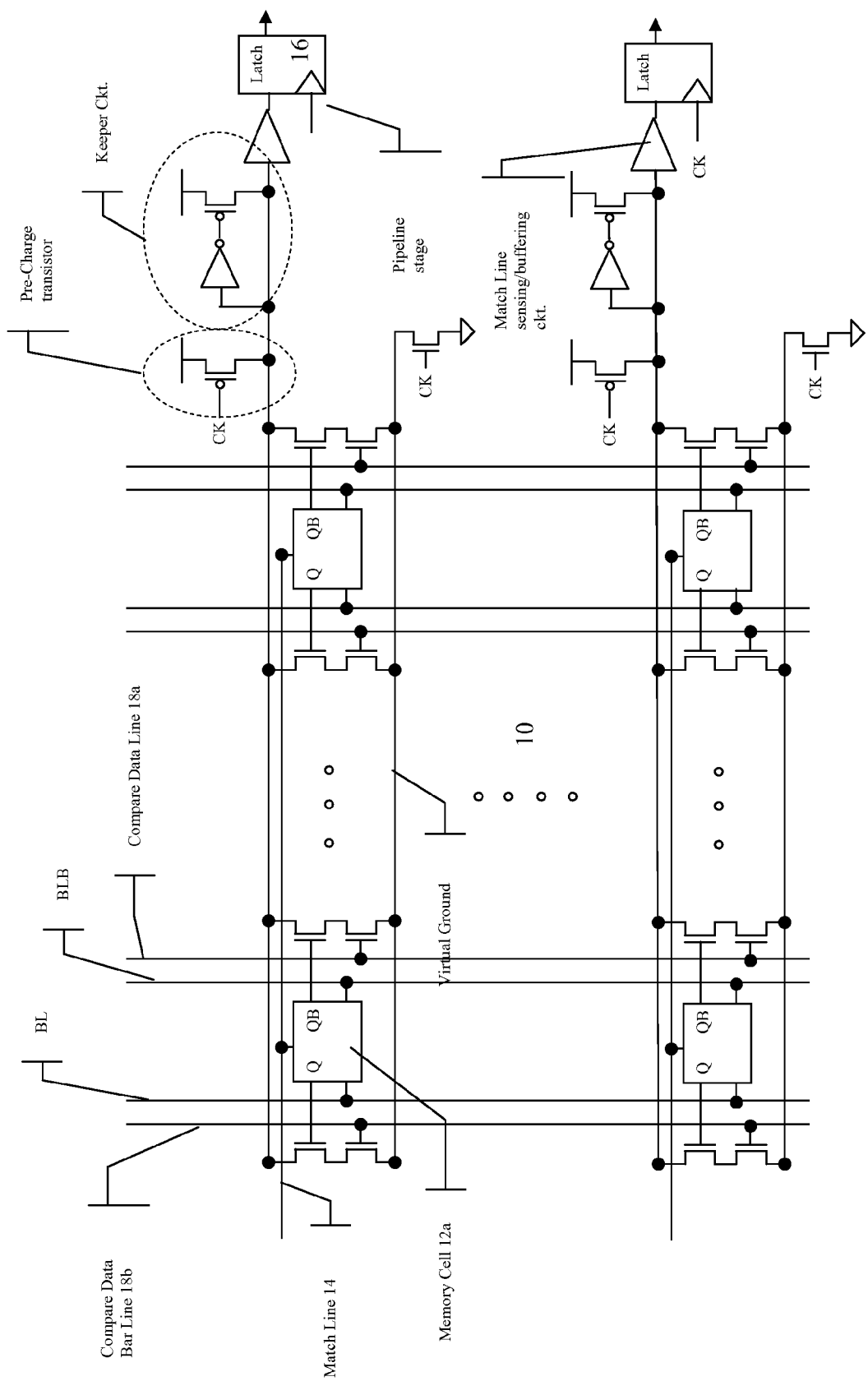
FIG. 1 is a block level diagram of a differential binary volatile content addressable memory array of the prior art.
Figure 2:
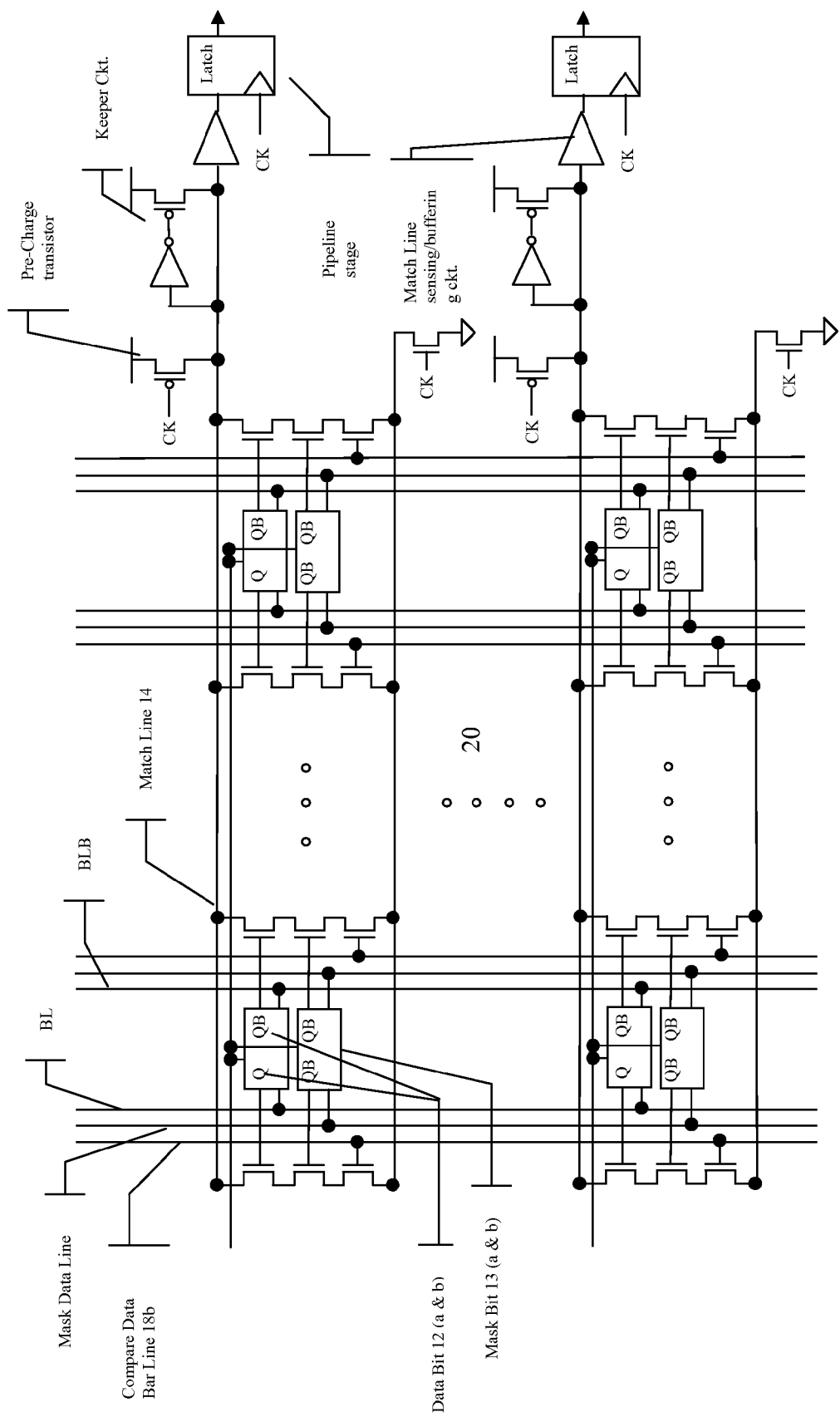
FIG. 2 is a block level diagram of a differential ternary volatile content addressable memory array of the prior art.
Figure 3:
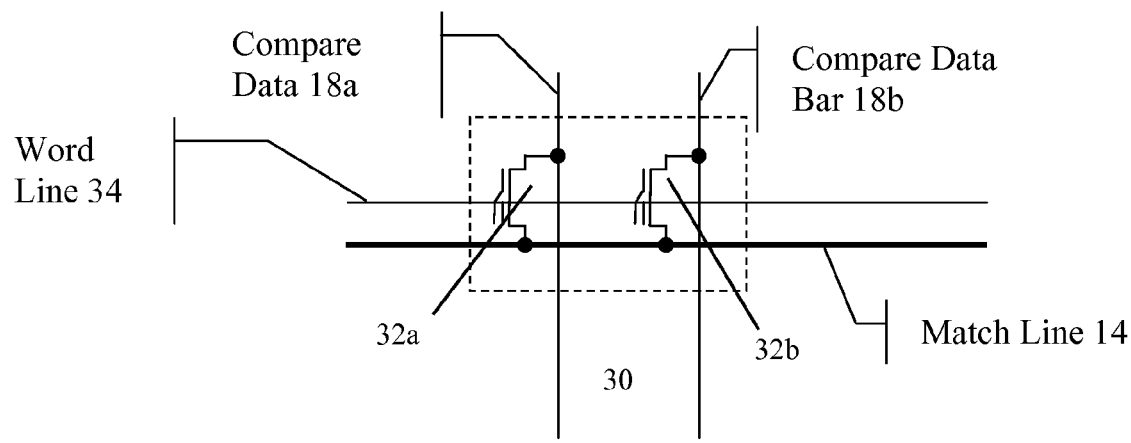
FIG. 3 is a circuit diagram of a differential ternary non-volatile content addressable memory cell of the prior art.
Figure 4:
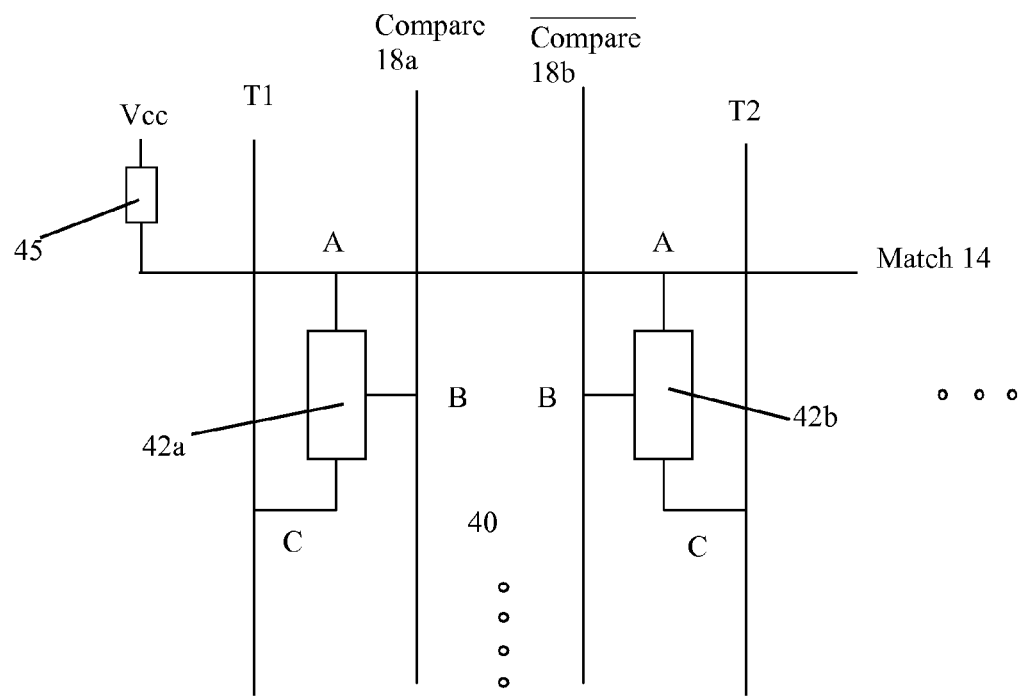
FIG. 4 is a first embodiment of a differential non-volatile content addressable memory cell of the present invention.

Referring to FIG. 4, there is shown a first embodiment of a differential non-volatile content addressable memory cell 40 of the present invention. The cell 40 comprises a pair of non-volatile storage elements 42a and 42b. Each non-volatile storage element 42 has three terminals: a first terminal labeled "A," a second terminal labeled "B," and a third terminal labeled "C." Each of the storage elements 42 is capable of being in one of two non-volatile states: a first state in which a first current flows between the first terminal A and the third terminal C and a second state in which a second current, less than the first current, flows between the first terminal A and the third terminal C. The second terminal B is a control terminal that controls the flow of current between the first terminal A and the third terminal C. The cell 40 also comprises a pair of differential data lines 18 labeled as "compare 18a" and "compare bar 18b." Each of the data lines 18 is connected to the second terminal B of one of the storage elements 42. The first terminals A of each of the storage elements 42a and 42b are connected to a match line 14. The match line 14 is connected to a load 45, which is connected to a source of voltage Vcc. The third terminal C of each of the pair of non-volatile storage elements 42a and 42b is connected to a respective T1 and T2 lines to which a second voltage, different from the voltage applied to the match line 14, is applied.

Figure 6A:
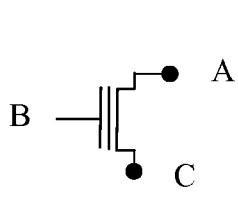
FIGS. 6A-6J are circuit diagrams of the storage elements that can be used in the first and second embodiments of the content addressable memory cells shown in FIGS. 4 and 5, respectively.

Referring to FIG. 6A, there is shown one embodiment of a non-volatile storage element 42 that can be used in the first embodiment of the cell 40 shown in FIG. 4. The embodiment shown in FIG. 6A is a conventional stack gate non-volatile transistor. The stack gate non-volatile transistor has a first terminal A and a third terminal C with a channel therebetween. A floating gate is over the channel and controls the conduction of current between terminal A and terminal C. A control gate B is capacitively coupled to the floating gate and is also over the channel. The second terminal B controls the flow of current between terminal A and terminal C.

Figure 6B:
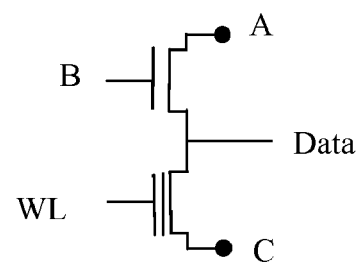

Referring to FIG. 6B, there is shown another embodiment of a non-volatile storage element 42 that can be used in the first embodiment of the cell 40 shown in FIG. 4. The embodiment shown in FIG. 6B is a conventional stack gate non-volatile transistor connected in series with a MOS switching transistor. The stack gate non-volatile transistor has a first terminal Data and a third terminal C with a channel therebetween. A floating gate is over the channel and controls the conduction of current between terminal Data and terminal C. A control gate is capacitively coupled to the floating gate and is also over the channel. The second terminal WL controls the flow of current between terminal Data and terminal C. The MOS switching transistor has three terminals: A, B, and a third terminal connected to the Data terminal of the stack gate non-volatile transistor. A channel is between the Data terminal and terminal A. terminal B controls the flow of current between terminal A and the Data terminal. Thus, the three terminals of the non-volatile storage element 42 are a first terminal A of the conventional MOS transistor, the third terminal C of the split gate non-volatile transistor, and the gate transistor B of the conventional MOS transistor. When the embodiment shown in FIG. 6B is used in the memory cell 40, of course, additional control lines supplying various signals must be supplied to the Data terminal and the WL terminal. The Data terminal is the terminal to which the data signal for storage in the storage element 42 is supplied when programming or storing that data into the storage element 42.

Figure 6C:
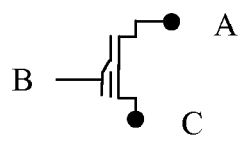

Referring to FIG. 6C, there is shown another embodiment of a storage element 42 than can be used in the memory cell 40. In the embodiment shown in FIG. 6C, a split gate non-volatile storage transistor of the type shown and disclosed in U.S. Pat. No. 5,029,130, whose disclosure is incorporated herein by reference in its entirety, is disclosed. The transistor 42 comprises a first terminal A, a third terminal C and a control terminal or second terminal B. A channel region is between the first terminal A and the third terminal C. A floating gate is capacitively coupled to the third terminal C and is over a portion of the channel region. The control gate B, or the second terminal, is over another portion of the channel and controls the conduction of the other portion of the channel between terminal A and terminal C. Thus, the control terminal B is closer to the first terminal A than to the third terminal C. Programming can occur by hot electron injection from terminal A accelerated to the floating gate and is injected thereto. Erase can occur by tunneling of electrons from the floating gate onto the control gate B. Other mechanisms for programming or erase are also possible and also known in the art.

Figure 6D:
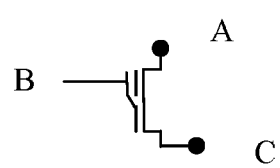

Referring to FIG. 6D, there is shown another embodiment of a storage element 42, which can be used in the memory cell 40. This storage element 42 is identical to the storage element shown in FIG. 6C, except the first terminal A is capacitively coupled to the floating gate. Thus, unlike the embodiment shown in FIG. 6C, the floating gate is closer to the first terminal A. The control gate, or the second terminal B, controls the portion of the channel between the floating gate and the third terminal C, and is closer to the third terminal C than to the first terminal A. In all other aspects of the operation of the storage element 42, such as erase or programming, the operation is identical to the embodiment shown in FIG. 6C.

Figure 6E:
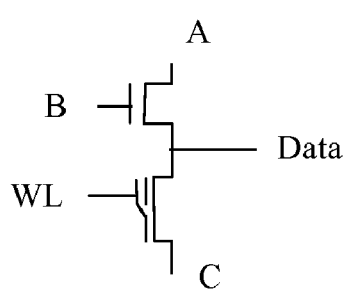

Referring to FIG. 6E, there is shown another embodiment of a storage element 42 that can be used in the memory cell 40. In this embodiment, the storage element 42 comprises a conventional MOS transistor electrically connected to a split gate non-volatile transistor of the type shown in FIG. 6C or 6D. Specifically, the conventional MOS transistor has three terminals: a first terminal labeled "A" and a third terminal labeled "Data" with a channel region therebetween. A gate terminal labeled "B" controls the conduction of the current between A and Data. The Data terminal is connected to the terminal labeled "A" of the storage transistor shown in FIG. 6D. The control terminal shown in FIG. 6D, labeled "B" in that figure, is controlled by a word line or WL signal. The terminal C of the storage transistor shown in FIG. 6D remains the terminal C shown in FIG. 6E. Thus, the three terminals of the non-volatile storage element 42 are a first terminal A of the conventional MOS transistor, the third terminal C of the split gate non-volatile transistor, and the gate transistor B of the conventional MOS transistor. When the embodiment shown in FIG. 6E is used in the memory cell 40, of course, additional control lines supplying various signals must be supplied to the Data terminal and the WL terminal. The Data terminal is the terminal to which the data signal for storage in the storage element 42 is supplied when programming or storing that data into the storage element 42.

Figure 6F:
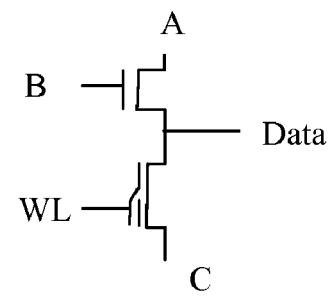

Referring to FIG. 6F, there is shown another embodiment of a non-volatile storage element 42 that can be used in the memory cell 40. Similar to the embodiment shown in FIG. 6E, in this embodiment, the storage element 42 comprises a conventional MOS transistor and a non-volatile storage element of the split gate type exactly as is shown in FIG. 6E, except the source/drain of the split gate non-volatile transistor are switched from that shown in FIG. 6E. In particular, the storage element 42 comprises a conventional MOS transistor having terminals A, B and Data, identical to that described for the embodiment shown in FIG. 6E. The MOS transistor is electrically connected to the split gate non-volatile transistor of the type shown in FIG. 6C, wherein the data terminal is connected to the terminal labeled A shown in FIG. 6C. The terminal labeled B of the embodiment shown in FIG. 6C is the WL terminal, and the terminal labeled C of the embodiment shown in FIG. 6C remains the terminal C of the storage element 42. In all other aspects, the non-volatile storage element 42 shown in FIG. 6F is identical in operation to the element shown in FIG. 6E.

Figure 6G:
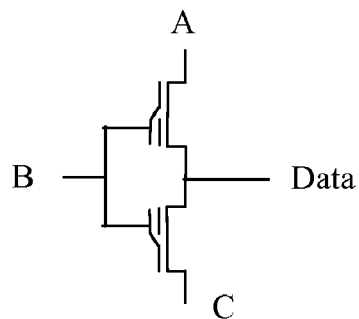

Referring to FIG. 6G, there is shown another embodiment of the non-volatile storage element 42 that can be used in the memory cell 40. All of the embodiments shown in FIGS. 6A through 6F are of the binary type. The embodiment shown in FIG. 6G is suitable for a memory cell 40 of the ternary type. Thus, the storage element 42 shown in FIG. 6G comprises two split gate non-volatile storage transistor connected in series. One of the two series non-volatile transistors stores the mask bit while the other stores the data content bit. The mask bit is used to mask (disable) the compare event for the particular ternary CAM cell. This is done by turning off the discharge current path through the series connected non-volatile transistors. If any one of the transistors in the series connected path is turned off, then the entire current path is turned off. Each of the split gate non-volatile transistors has a first terminal and a third terminal with a channel therebetween. The floating gate is closest to the third terminal and is capacitively coupled thereto. The third terminals of the two non-volatile transistors are connected together and to the Data node. First terminals, which are the terminals farthest away from the floating gate, are labeled terminal "A" and terminal "C," respectively. The terminal B is connected to the control gate of both of the storage transistors. The Data terminal is the terminal to which the data signal for storage in each of the storage transistors of the storage element 42 is supplied when programming or storing that data into each of the storage transistors.

Figure 6H:
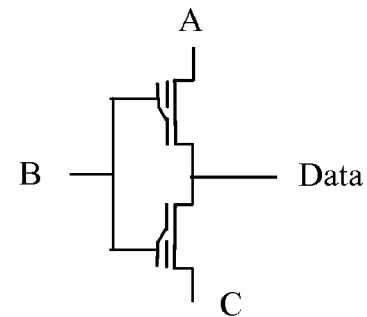

Referring to FIG. 6H, there is shown another storage element 42 suitable for use in the memory cell 40 for use as a ternary content addressable memory cell. The storage element 42 shown in FIG. 6H is similar to the storage element 42 shown in FIG. 6G in the use of two serially connected split gate storage transistors. The only difference between the embodiment shown in FIG. 6H and the embodiment shown in FIG. 6G is that the Data terminal is connected in common to the terminals of the two storage transistors whose terminals are farthest away from the floating gate. Thus, the first terminal, labeled "A," is the terminal of one of the storage transistors closest to the floating gate. The terminal labeled "C" is a terminal closest to the floating gate of the other storage transistor. The control gates of the two storage transistors are connected together and to terminal B.

Figure 6I:
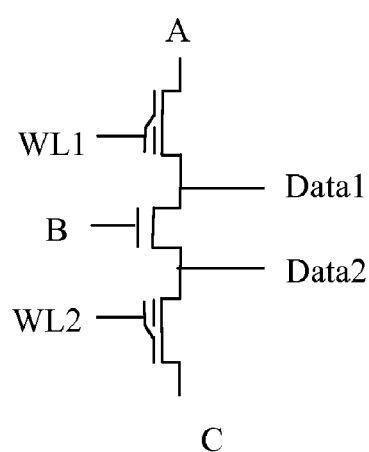

Referring to FIG. 6I, there is shown yet another embodiment of a storage element 42 suitable for use in a ternary content addressable memory cell 40. In this embodiment, the storage element 42 comprises a split gate storage transistor connected to a Data1 node which is connected in series to a conventional MOS transistor, which is connected to a Data2 node and is connected to second split gate storage transistor. Each of the split gate storage transistors has a terminal which is closest to the floating gate and is connected to the Data1 and Data2 nodes, respectively. The terminal of the split gate storage transistor which is farthest away from the floating gate is labeled terminal "A" and terminal "C," respectively. The second terminal of the storage element 42 is connected to the gate of the MOS transistor. The control gate of the two storage transistors are supplied with the signals WL1 and WL2, respectively.

Figure 6J:
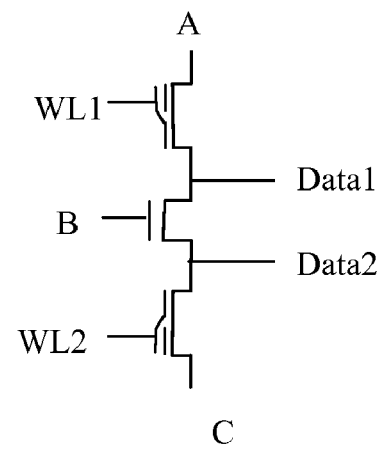

Referring to FIG. 6J, there is shown yet another embodiment of a storage element 42 that can be used in a ternary memory cell 40. The embodiment shown in FIG. 6J is similar to the embodiment shown in FIG. 6I in that it comprises a split gate non-volatile storage transistor connected in series to a conventional MOS transistor connected to a second split gate non-volatile storage transistor. The only difference is that the terminal A of the storage element 42 is the terminal of the split gate transistor which is closest to the floating gate thereof. Similarly, the terminal C is the terminal of the split gate transistor which is closest to the floating gate thereof. In all other aspects, the storage element comprises a Data1 node which connects the terminal which is farthest away from the floating gate of the first storage transistor to one of the terminals of the MOS transistor. A Data2 terminal connects the other terminal of the MOS transistor to the terminal that is farthest away from the floating gate of the second storage transistor. A WL1 and a WL2 signal is provided to each of the control gates of the first and second storage transistors, respectively. The terminal B of the storage element 42 is connected to the gate of the MOS transistor.

Each of the aforementioned described embodiments of the storage element shown in FIG. 6A-6J can be used in the memory cell 40 shown in FIG. 4. To the extent that other signal lines must be provided, such as to the Data signal or the WL signal, then lines must be provided to the memory cell 40.

Figure 5:
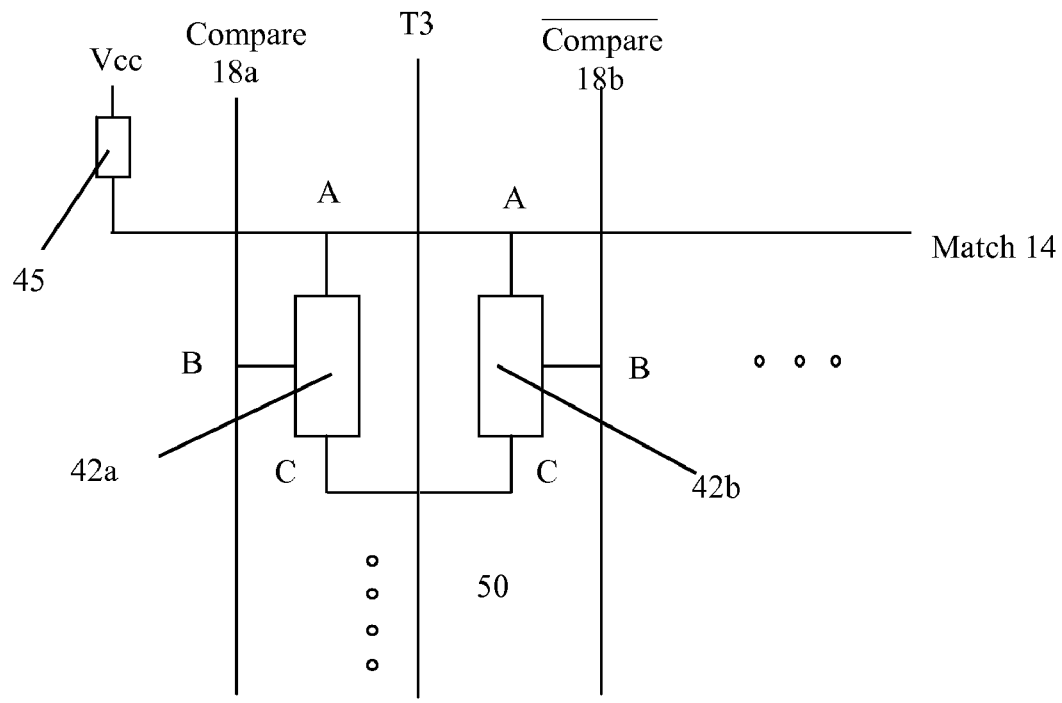
FIG. 5 is a second embodiment of a differential non-volatile content addressable memory cell of the present invention.

Referring to FIG. 5, there is shown a second embodiment of an improved differential non-volatile content addressable memory cell 50. The memory cell 50 comprises a pair of non-volatile storage elements 42a and 42b, each of which can be of the embodiment shown in FIGS. 6A-6J. As previously discussed, each of the non-volatile storage elements 42 comprises three terminals: a first terminal A, a third terminal C, with a second terminal B controlling the conduction of current between terminal A and terminal C. The first terminal A of the two storage elements 42a and 42b are connected to the match line 14. The match line 14 is connected through a load 45 to Vcc. The terminals B of each of the storage elements 42a and 42b are connected to the compare line 18a and compare bar lines 18b, respectively. Finally, the terminal C of the two storage elements 42a and 42b are connected together and in common to a control line T3. During operation, the voltage supply on the control line T3 is at a second voltage which differs from the voltage supplied to the match line 14.

Figure 7:
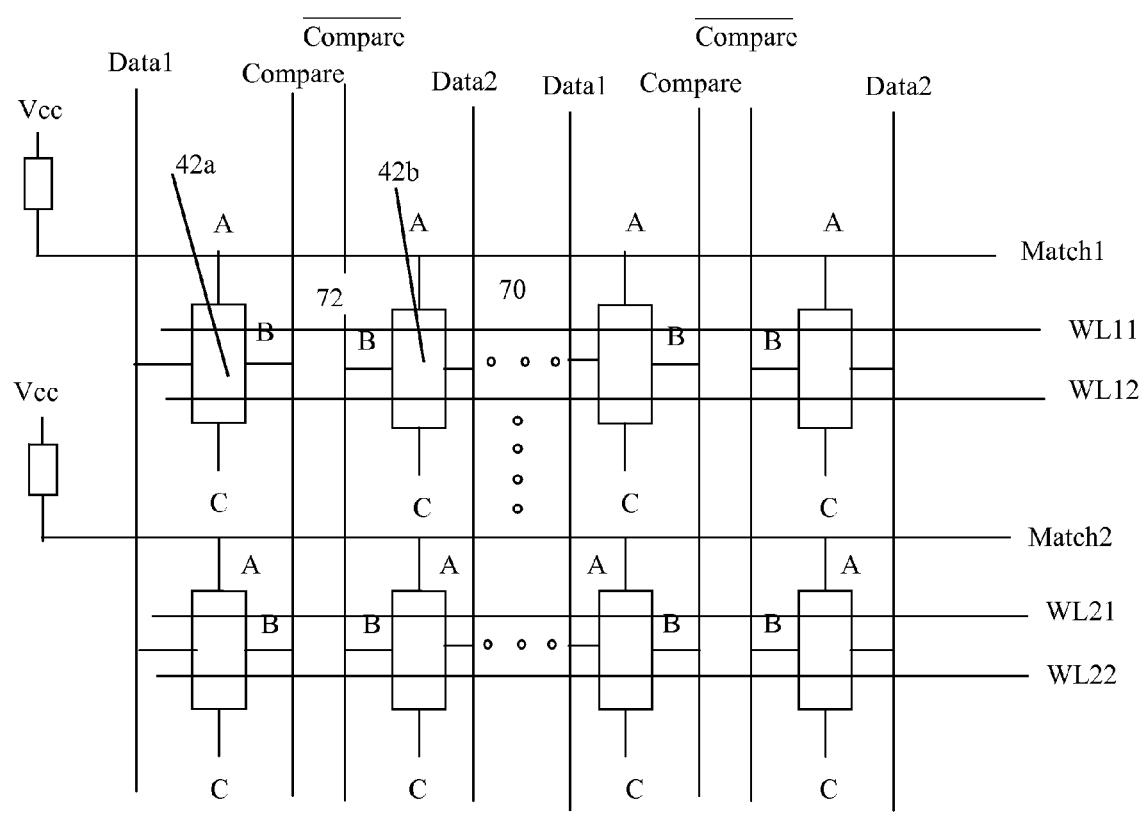
FIG. 7 is a circuit diagram of a first embodiment of an array of differential non-volatile content addressable memory cells, of the present invention, in which the cells of FIGS. 4 and 5 of the present invention may be used.

Referring to FIG. 7, there is shown a first array 70 of a plurality of differential non-volatile content addressable memory cells 42 arranged in a plurality of rows and columns. Each of the memory cells 72 can be of the first embodiment shown in FIG. 4, or the second embodiment shown in FIG. 5. Each of the memory cells 72 comprises a pair of storage elements 42a and 42b, each having three terminals, labeled "A" "B" and "C." The B terminals of each memory cell 72 are connected to the compare line and compare bar lines, respectively. The compare line and compare bar lines connect the B terminals of memory cell 72 that are arranged in the same column. It should be noted that the term "column" and "row" can be used interchangeably. The a terminals of memory cell 72 arranged in the same row are connected together to the same match line, e.g. Match1. To the extent that the storage element 72 requires a WL signal, such as that for the embodiment shown in FIG. 6B, 6E, 6F, or 6I or 6J, then all the memory cells 72 arranged in the same row have their WL lines connected together. To the extent that the storage element 72 is of the embodiment that requires a Data signal supplied thereto, then the Data lines of the storage element 72 arranged in the same column are connected together. In all other aspects, the operation of the memory array 70 is the same as that described for the various embodiment discussed previously.

Figure 8:
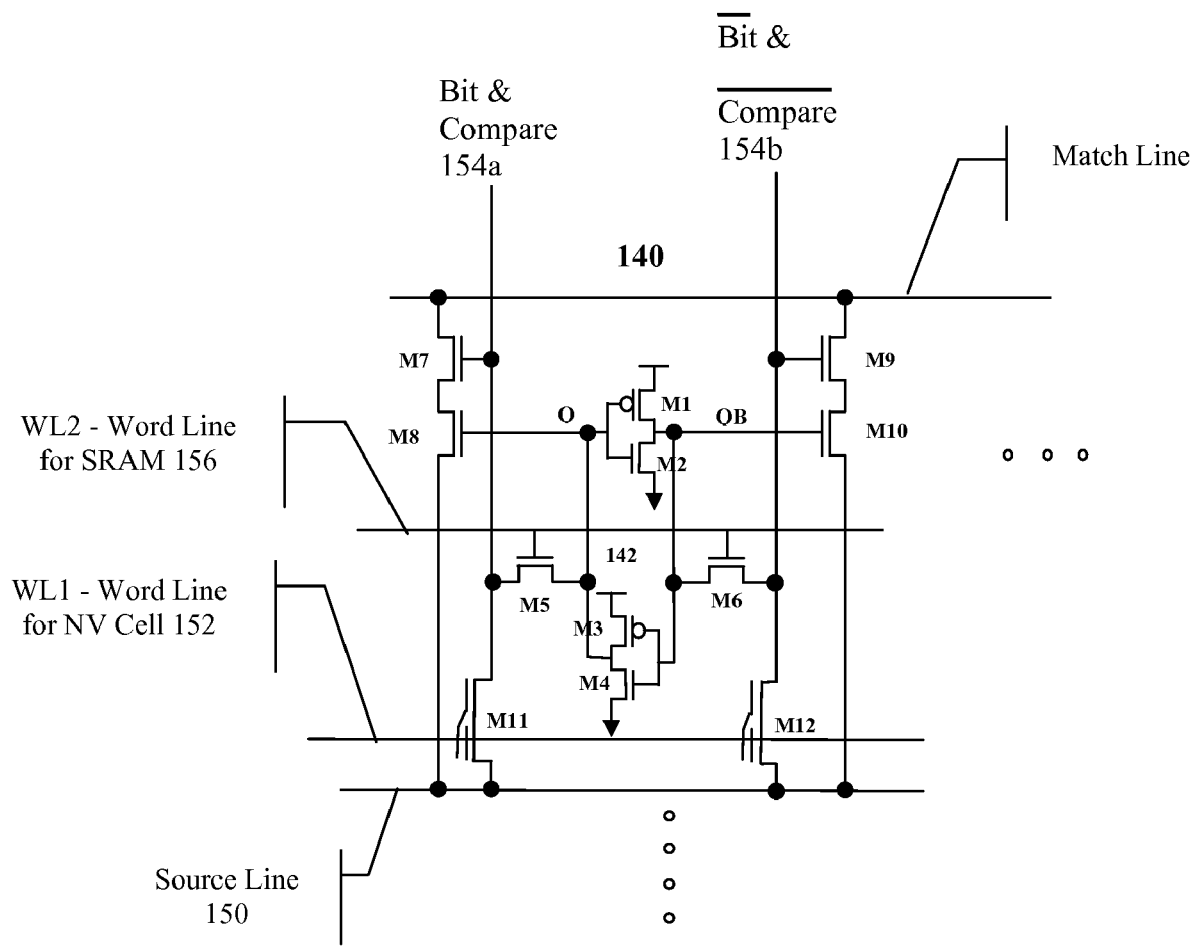
FIG. 8 is a third embodiment of a differential non-volatile content addressable memory cell of the present invention.

Referring to FIG. 8 there is shown a circuit diagram of a third embodiment of a memory cell 140 of the present invention. The memory cell 140 shown in FIG. 8 comprises a volatile memory cell 142, for storing Q and Q(Bar) of the data. The transistors M1, M2, M3 and M4 form the volatile memory cell 142. The cell 140 also comprises two non-volatile single transistor cells M11 and M12, for storing Q and Q(Bar) of the data respectively. Although single transistor memory cell of the type shown in FIG. 6C (or 6D) is shown as being used for the memory cell M11 or M12, other types of non-volatile memory transistors may also be used. A source line 150 connects to the first (source or drain) region of the transistors M11 and M12. A first word line 152 connects to the gates of the transistors M11 and M12. A bit/compare line 154a connects to the second (drain or source) region of the transistor M11; a bit(bar)/compare(bar) line 154b connects to the second (drain or source) region of the transistor M12. Transistors M5 and M6 connect the bit/compare line 154a and bit(bar)/compare(bar) line 154b to the Q and Q(bar) nodes of the volatile memory cell 142. A second word line 156 is connected to the gate of transistors M5 and M6. Finally, transistors M7, M8, M9 and M10 are pull down transistors which are controlled by bit/compare line 154a and bit(bar)/compare(bar) line 154b and by the output of the volatile cell 142. The pull down transistors M7, M8, M9 and M10 can pull down the match line 14 in the event of a mismatch between the bit/compare (or bit(bar)/compare(bar)) data and the data stored in the volatile memory cell 142.

In the operation of the memory cell 140, data is first stored in the non-volatile transistors M11 and M12 (either as 0 and 1 or 1 and 0, respectively). This can be accomplished by bringing the source line 150 to a first high positive potential, such as +10 volts. The first word line 152 is brought to a high voltage sufficient to turn on a portion of the channel region of the transistors M11 and M12. If transistor M11 is to be programmed, i.e. have electrons stored on its floating gate, then a zero volt or voltage lower than the voltage supplied to the first word line 152 is applied to the bit/compare line 154a. If transistor M12 is to remain erased, i.e. not have any have electrons stored on its floating gate, then a voltage higher than the voltage supplied to the first word line 152 is applied to the bit(bar)/compare(bar) line 154b. Transistors M11 and M12 are then programmed and not programmed respectively, by the action of electrons injected through the mechanism of hot electron injection from the channel region to the floating gate, all as disclosed in U.S. Pat. No. 5,029,130.

Once the non-volatile cell portion of the memory cell 140 is programmed, then during operation, the following occurs. Upon power up of the device containing the cell 140, the contents of transistors M11 and M12 are stored in the volatile memory cell 142. This can occur in the following manner. The source line 150 is brought to a ground potential. A relative low positive potential is applied to the first word line 152, sufficient to turn on the a portion of the channel region over which the first word line 152 lines. A small positive potential, such as +3 volts is applied to the bit/compare and bit(bar)/compare (bar) lines 154a and 154b. Assume now that transistors M11 is programmed (and therefore transistor M12 remains erased). In that event, line 154a would remain at a voltage of approximately +3 volts, since the programmed floating gate on transistor M11 would prevent any significant flow current through transistor M11. On the other hand, with the floating of transistor M12 erased, current would flow through transistor M12, bringing the voltage of line 154b to substantially ground. A positive voltage is supplied to the second word line 156 sufficient to turn on transistors M5 and M6, causing the voltages on the lines 154a and 154b to be supplied to the Q and QB nodes, respectively. At this point, the volatile memory cell 142 is stored with the data stored in the non-volatile transistors M11 and M12.

When it is desired to compare the data in each cell 140, the match line 14 is first precharged to a precharged voltage. The source line 150 is connected to ground. The data to be compared is supplied on the bit/compare and bit(bar)/compare (bar) lines 154a and 154b, respectively. Assume that the data stored in the volatile memory cell 142 is as follows: Q(+0V) and QB(+3V). In that event, transistor M10 is turned on, and transistor M8 is off. Assume that the data supplied on the compare lines 154a and 154b are as follows: 154a(+3V) and 154b(0V). In that event, transistor M7 is turned on and transistor M9 remains off. Since transistors M7 and M8 are not both on, the current path through transistors M7 and M8 remains off. Similarly, since transistors M9 and M10 are not both on, the current path through transistors M9 and M10 remains off. In that event, the precharged voltage on match line 14 remains at the precharged state. This condition represent a matched condition between the compare lines 154a and 154b, and the data in the volatile memory cell 142. In the event, the data stored in the volatile memory cell 142 is as follows: Q(+3V) and QB(+0V) and the data supplied on the compare lines 154a and 154b remains as: 154a(+3V) and 154b(0V), then transistor M7 is on, transistor M8 is on, transistor M9 is off, and transistor M10 is off. In that event, the precharged voltage on match line 14 would discharge through transistors M7 and M8, to the source line 150. This is the mis-match condition. Detection of a change in the precharge voltage on the match line 14 would indicate whether a mis-match condition occurred.

Figure 9:
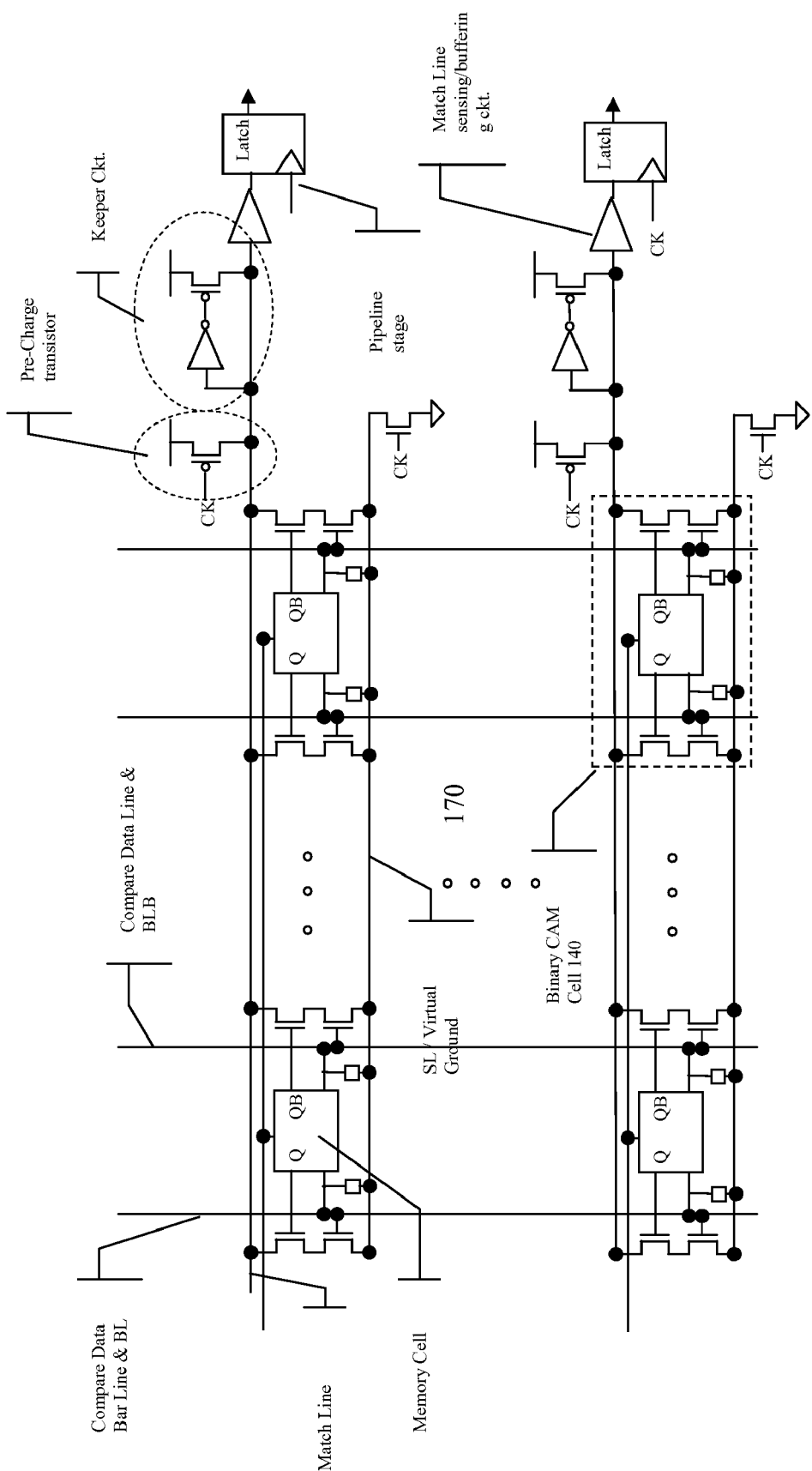
FIG. 9 is a circuit diagram of a second embodiment of an array of differential non-volatile content addressable memory cells, of the present invention, in which the cells of FIG. 8 of the present invention may be used.

Referring to FIG. 9 there is shown a schematic diagram of an array 170 of the present invention using the memory cells 140 shown in FIG. 8. The memory cells are arranged in a plurality of row s and columns. It should be understood that the terms rows and columns may be interchanged. Memory cells 140 arranged in the same row share a common match line 14. Memory cells arranged in the same column share the common bit/compare and bit(bar)/compare(bar) lines 154a and 154b, respectively.

One of the advantages of the memory cell 140 and array 170 of the present invention is that the cell 140/array 170 share the best of both worlds of non-volatility and speed or operation. The non-volatile transistors M11 and M12 retain the data even when power is turned off. The volatile memory cell 142 offer speed of performance. Finally, only a single bit/compare line 154a (along with its complement 154b) is used for both storing data into the non-volatile transistor M11 (or M12) and for comparing the data on the compare line with the data in the volatile memory cell 142.

From the foregoing, it can be seen that a differential non-volatile content addressable memory cell and array in which the compare data signal (and compare data bar signal) is used to control the flow of current in a channel results in a content addressable memory cell 72 (and array) which operates with high speed. Further, because the compare data (and compare data bar) lines are not used as a current source, i.e. they are not connected to the channel of a transistor, leakage current is minimized. This results in low power operation.

What is claimed is:

1. A non-volatile content addressable memory cell comprising:
   a non-volatile storage element capable of being in one of two non-volatile states: a first state in which a first current flows through said storage element, and a second state in which a second current less than said first current flows through said storage element;
   a match line;
   a volatile storage element capable of storing said first state and said second state; said volatile storage element having a first output for controlling the flow of current from said match line; and
   a data line for supplying data to said non-volatile storage element, and for transferring the data from said non-volatile storage element to said volatile storage element; and for controlling the flow of current from said match line.

2. The non-volatile content addressable memory cell of claim 1 wherein said non-volatile storage element comprises:
   a first terminal in a semiconductor substrate;
   a second terminal in said semiconductor substrate;
   a channel between said second terminal and said first terminal;
   a floating gate disposed over a first portion of said channel and said second terminal and is insulated therefrom; and
   a control gate having a first section disposed over a second portion of said channel and insulated therefrom, and having a second section over said floating gate and is insulated therefrom.

3. A non-volatile content addressable memory array comprising:
   a plurality of cells arranged in a plurality of rows and columns; each cell comprising:
   a non-volatile storage element capable of being in one of two non-volatile states: a first state in which a first current flows through said storage element, and a second state in which a second current less than said first current flows through said storage element;
   a match line connecting cells arranged in the same row;
   a volatile storage element capable of storing said first state and said second state; said volatile storage element having a first output for controlling the flow of current from said match line; and
   a plurality of data lines each connecting cells in the same column, and for supplying data to one of said non-volatile storage elements, and for transferring the data from said non-volatile storage element to said volatile storage element; and for controlling the flow of current from said match line.

4. The non-volatile content addressable memory cell of claim 3 wherein said non-volatile storage element comprises:
   a first terminal in a semiconductor substrate;
   a second terminal in said semiconductor substrate;
   a channel between said second terminal and said first terminal;
   a floating gate disposed over a first portion of said channel and said second terminal and is insulated therefrom;
   a control gate having a first section disposed over a second portion of said channel and insulated therefrom, and having a second section over said floating gate and is insulated therefrom; and
   wherein said data line connects to said first terminal of each non-volatile storage element.

5. The memory cell of claim 1 wherein a single bit/compare line is used both for storing data into non-volatile memory and for comparing data on a compare line with data in the volatile storage element.

6. The memory cell of claim 1 wherein a compare data signal is used to control current flow in a channel.

7. The memory cell of claim 1 wherein a compare data line is not connected to a transistor channel, thereby reducing leakage current.

8. The memory cell of claim 6 wherein a compare data line is not connected to a transistor channel, thereby reducing leakage current.

9. The memory cell of claim 2 wherein said data line connects to said first terminal of said non-volatile storage element.

10. The memory cell of claim 3 wherein a single bit/compare line is used both for storing data into non-volatile memory and for comparing data on a compare line with data in the volatile storage element.

11. The memory cell of claim 3 wherein a compare data signal is used to control current flow in a channel.

12. The memory cell of claim 3 wherein a compare data line is not connected to a transistor channel, thereby reducing leakage current.

13. The memory cell of claim 3 wherein said non-volatile storage element comprises:
   a first terminal in a semiconductor substrate;
   a second terminal in said semiconductor substrate;
   a channel between said second terminal and said first terminal;
   a floating gate disposed over a first portion of said channel and said second terminal and is insulated therefrom; and
   a control gate having a first section disposed over a second portion of said channel and insulated therefrom, and having a second section over said floating gate and is insulated therefrom.

* * * * *